United States Patent [19]

Chen et al.

[11] Patent Number: 5,342,736
[45] Date of Patent: Aug. 30, 1994

[54] METHOD OF WET ETCHING OF POLYIMIDE

[75] Inventors: Ker-Ming Chen, Hsinchu; Tsung-Hsiung Wang; Shing-Shing King, both of Taipei; Tzong-Ming Lee, Tainan, all of Taiwan

[73] Assignee: Industrial Technology Research Institute, Taiwan

[21] Appl. No.: 821,632

[22] Filed: Jan. 16, 1992

[51] Int. Cl.⁵ ............................................. G03C 1/93
[52] U.S. Cl. .................................. 430/323; 430/313; 430/271; 430/272
[58] Field of Search ............... 430/323, 271, 272, 313, 430/317

[56] References Cited

U.S. PATENT DOCUMENTS

| | | | |
|---|---|---|---|
| 4,092,442 | 5/1978 | Agnihotri et al. | 430/323 |
| 4,624,740 | 11/1986 | Abrams et al. | 430/317 |
| 5,043,248 | 8/1991 | Uekitz et al. | 430/283 |

FOREIGN PATENT DOCUMENTS

| | | |
|---|---|---|
| 61-171132 | 6/1986 | Japan. |
| 63-274942 | 3/1988 | Japan. |
| 2-194571 | 5/1990 | Japan. |
| 2-299234 | 7/1990 | Japan. |

*Primary Examiner*—Christopher Rodee
*Attorney, Agent, or Firm*—Scully, Scott, Murphy & Presser

[57] ABSTRACT

A method of wet etching of polyimide comprising the steps of
(a) cleaning a substrate for coating;
(b) coating a polyamic acid varnish onto said cleaned substrate;
(c) thermal curing the varnish in (b) to form a polyimide layer on the substrate;
(d) coating a polyamide-imide varnish onto the layer in (c);
(e) curing the varnish in (d),
(f) coating a layer of photoresist onto the coated substrate;
(g) masked exposing;
(h) image developing on said substrate; and
(i) wet etching the unprotected portion in the layers of polyimide and polyamide-imide to form a staircase pattern on the substrate.

5 Claims, 4 Drawing Sheets

METHOD OF WET ETCHING OF POLYIMIDE

BACKGROUND OF THE INVENTION

The present invention relates to a method of wet etching of polyimide, in particular, a method of etching polyimide by using polyamide-imide and an etchant to form a staircase pattern on an insulation substrate.

Polyimide is a high temperature resistant, low dielectric constant polymer. It is widely used as an insulating material in, for instance, Flexible printed circuit (FPC), tape automatic bonding (TAB) and electronic packaging.

In general, the bonding between the polyimide and the conventional photoresist is relatively poor, and a center layer is provided in between them to increase the bonding. For instance, Japan Patent No. 2-299234, No. 2-194571, and Sho-63-274942 respectively disclose a layer of $Si_3N_4$ film, a layer of $SiO_2$, and a layer of aluminium alcoholate to be provided in between the layers of polyimide and photoresist. However, the anti-etching property of $Si_3N_4$ and aluminium alcoholate is strong. As a result, dry etching, for example by the method of plasma, the activated ionic etching is employed, and a steeper sidewall can be obtained. In case wet etching is employed, an inclined smooth sidewall can be obtained. But, in the metallization process, the coated metal side wall of the steep sidewall may be too thin or not coated, which will produce discontinuation or short circuit. Although the inclined smooth sidewall can overcome the above drawbacks, the smooth surface has a relative poor bonding between the surface per se and the metal. In addition, the method of vapor coated or sputtered $Si_3O_4$, $SiO_2$ is complicated and expensive. The cost of aluminium alcoholate is high, which makes it unsuitable for manufacturing.

Japan Patent Sho-61-171132 discloses the use of polymer of polyimide or the like property as the center layer, in which the incomplete imidized polyimide is used as a removable layer and a resisting layer of anti-plasma is added, and then applied to the wet etching. Using $O_2$ plasma on two layers of polyimide film of two different etched rates and by employing different thicknesses in designing the gradient of the sidewall so as to increase the bonding surface area and strength of metals during the metallization process are found to be unsatisfactory. However, the bonding strength of the polyimides is poor, and if the removeable layer of the polyimide is not removed, there is a possibility that this layer will peel off. If this layer is to peel off, the cost of manufacturing will increase and the manufacturing process will be complicated.

In accordance with the present invention, polyamide-imide having the property of or similar to the property of polyimide as the pseudomask layer, and by employing the different etched rates of the etchant respectively on polyimide and polyamide-imide and differences in undercutting forming viahole to form staircase pattern, the surface of contacting and bonding strength of metals during metallization will increase the quality of the product.

SUMMARY OF THE INVENTION

Accordingly, it is an object of the present invention to provide a method of wet etching of polyimide by making use of polyamide-imide having the same property of polyimide as a center layer in between the polyimide and a photoresist.

It is another object of the present invention to provide a method of wet etching of polyimide, wherein the surface of contacting and bonding strength of metals during metallization is increased.

These and other objects, advantages and features of the present invention will be more fully understood and appreciated by reference to the written specification.

BRIEF DESCRIPTION OF THE DRAWINGS

The present invention will be further explained with reference to the annexed drawings, wherein.

DETAILED DESCRIPTION OF THE INVENTION

While this specification concludes with claims particularly pointing out and distinctly claiming that which is considered to be the invention, it is believed that the invention can be better understood from a reading of the following detailed description of the invention and the appended examples.

The present invention in its broadest context encompass a method of producing a polyimide comprising the steps of (a) cleaning a substrate for coating;

(b) coating a polyamic acid varnish onto said cleaned substrate;

(c) curing the varnish in (b) to form a polyimide layer on the substrate;

(d) coating a polyamide-imide varnish onto the layer in (c);

(e) curing the varnish in (d);

(f) coating a layer of photoresist onto the coated substrate;

(g) masked exposing;

(h) image developing on said substrate; and (i) wet etching the unprotected portion in the layers of polyimide and polyamide-imide to form a staircase pattern on the substrate.

Figure 1:
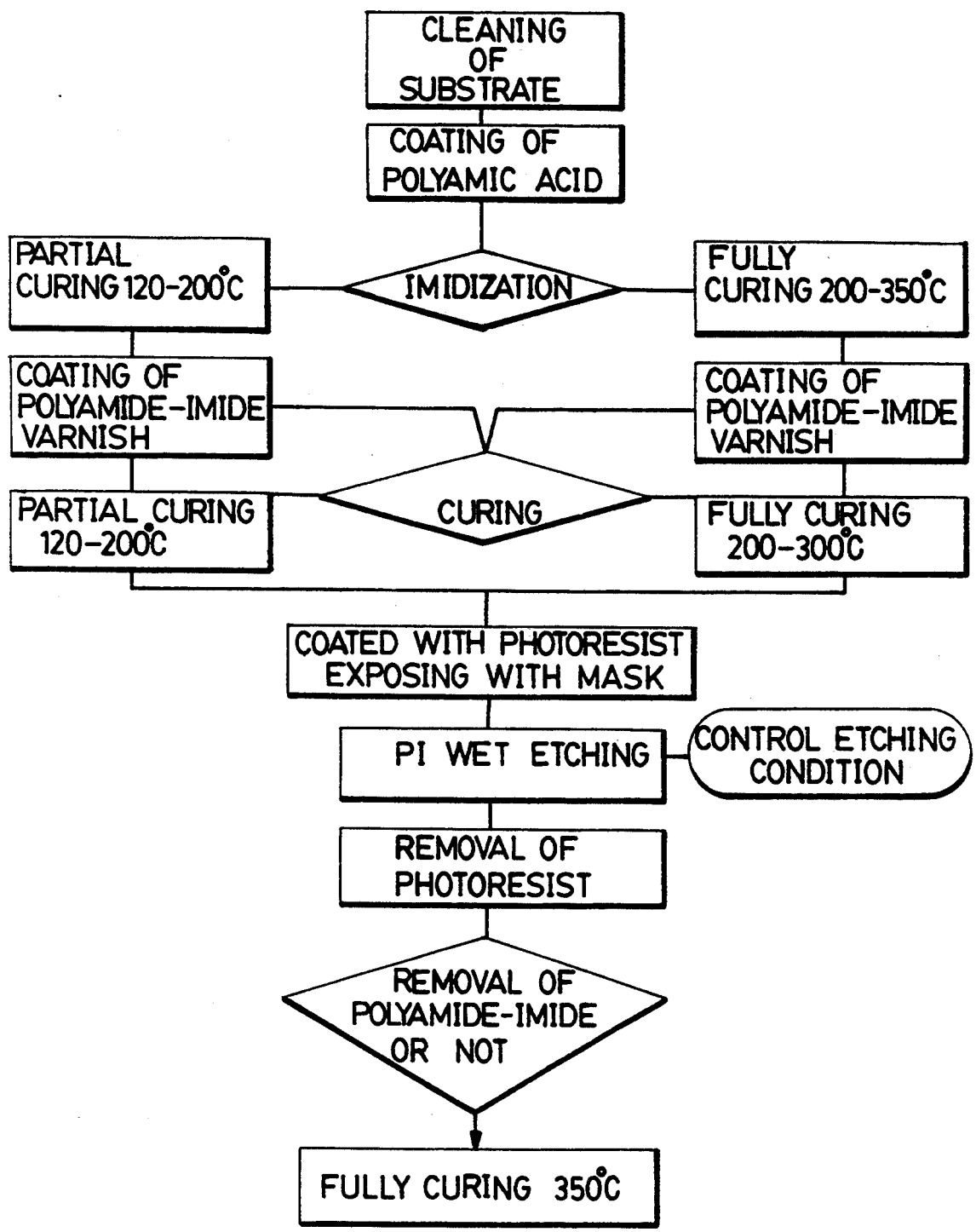
FIG. 1 is a flowchart showing the method of wet etching of polyimide in accordance with the present invention.

Referring to FIG. 1, there is shown a flowchart illustrating the method of wet etching of polyimide in accordance with the present invention. In accordance with the present invention, polyamide-imide having the same property as polyimide and of little structural difference is used as pseudo mask layer and by use of an etchant which causes different etched rates on the individual polyimide and polyamide-imide and the difference on the degree of undercut to form stair pattern. These actions will increase the bonding surface and bonding strength between metals during the metallization process.

In accordance with present invention, the employed raw materials consist of etchant, polyimide precursor polyamic acid, polyamide-imide varnish, and a photoresist.

ETCHANT

The etchant used in this method is an alkali metal hydroxide, for instance sodium hydroxide and potassium hydroxide, hydrazine hydrate, ethylenediamine, metal sulfates, carbonates, phosphates and borates, water, N,N-dimethylformamide, DMF, or 1-methyl-2-pyrrolidinone, NMP.

POLYIMIDE PRECURSOR-POLYAMIC ACID

The polyimide precursor polyamic acid is obtained by conventional art and has the following structure:

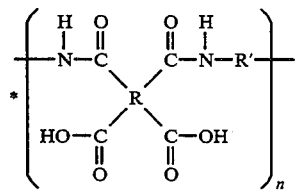

wherein R and R' are individually selected from the group consisting of aromatic group, aliphatic group, ring aliphatic group and group containing siloxane.

The solid content thereof ranges from 10% to 20%.

POLYAMIDE-IMIDE VARNISH

The polyamide-imide varnish is obtained from conventional art and having the following structure:

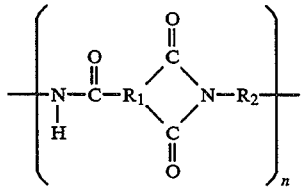

wherein R1 and R2 are individually selected from the group consisting of aromatic group, aliphatic group, ring aliphatic group and group containing siloxane.

The solid content thereof is ranging from 10% to 60%.

PHOTORESIST

The photoresist used in accordance with the present invention is the conventional non-aqueous type of photoresist.

EXAMPLE 1

(A) The Synthesis of Polyamic Acid 6.38 g of 4,4'-diamino diphenylether (ODA) was placed in a glass reactor. 150 g of N-methyl-2-pyrrolidinone (NMP) was added to the above by mechanical stirring. The reaction temperature was maintained at 0° to 25° C. and then passed through with nitrogen. After the 4,4'-diamino diphenylether had completely dissolved, 10.28 g of 3,3',4,4'-benzophenone tetracarboxylic acid dianhydride (BTDA) was added. The reaction was proceeded continuously for 4 to 6 hours. A viscous polyamic acid having solid content of 10% was thus obtained.

(B) The Synthesis of Polyamide-Imide 25 g of methylene diisocyanate (MDI) was placed in a 500 ml-three-necked flask containing 19.2 g of trimellitic anhydride. After that, 100 ml of dimethylacetamide was then added. Reaction was for 2 hours at 160° C. until no bubbles formed. The product was cooled. A polyamide-imide varnish having solid content of 31% and viscosity of 5000 cps was obtained.

(C) Preparation of Etchant

In accordance with the present invention, the etchant was prepared at a temperature of 70° C. by the use of hydrazine hydrate and ethyldiamine, sodium hydroxide solution, sodium carbonate solution and 1-methyl-2-pyrrolidinone. The ratio of the individual components is as follows:

hydrazine hydrate and ethyldiamine: sodium hydroxide solution: sodium carbonate solution: 1-methyl-2-pyrrolidinone = 10:6:1:2.

(D) Photoresist

Photoresist is Fuji WAYCOAT SC-450.

Figure 2A:
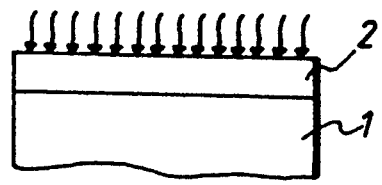
FIGS. 2a through 2e represent views showing the preferred embodiment of wet etching in accordance with the present method.

In accordance with the present invention, and as is illustrated in FIG. 2a, several drops of polyamic acid varnish (2) is coated onto a cleaned substrate (1) by the method of rotational coating. Examples of the substrate are silica chips, ceramic, etc. The speed of rotation is kept at 1500 rpm, and the coating time is 20 sec. A uniform coated film is formed. Several substrates coated with polyamic acid are cured and sampled under the following temperatures and time:

| TEMPERATURE | TIME |
|---|---|
| 100 | 30 |
| 125 | 30 |
| 150 | 30 |
| 175 | 30 |
| 200 | 30 |
| 250 | 30 |
| 300 | 30 |
| 350 | 30 |

Figure 2B:
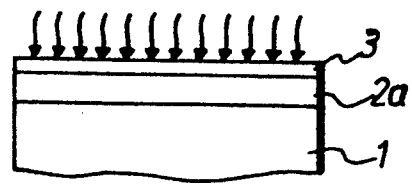
Figure 2C:
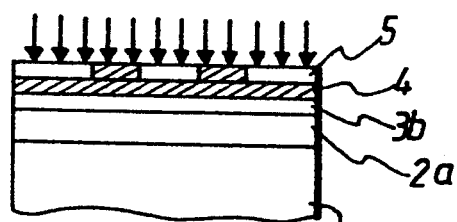

After thermal curing, said polyamic acid varnish (2) will become polyimide (2a). See FIG. 2(b). As also shown in FIG. 2(b), polyamide-imide varnish (3) is coated onto the heated cured substrate (1) obtained from the above in a similar procedure to the above. In the same way, after curing, said polyamide-imide varnish (3) will become polyamide-imide (3b), as shown in FIG. 2(c).

Figure 2D:
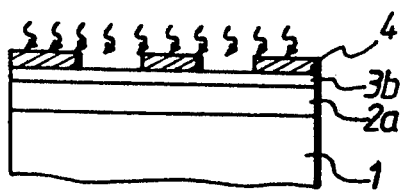

Photoresist (4) is then coated at the temperature of 80° C. by rotational coating. After pre-roasting, an appropriate mask (5) is selected and the exposition, imaging and cured-roasted are proceeded at 130° C. to form a pattern. See FIGS. 2(c) and 2(d).

Figure 2E:
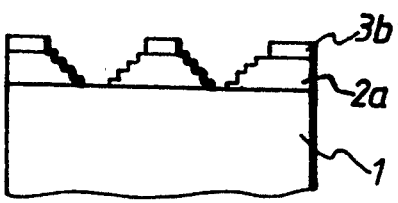

Substrate (1) formed with pattern is placed into etchant at 70° C. The region of polyimide (2a) and polyamide-imide (3b) which has not been protected with said mask (5) is etched away so as to transfer the pattern. Due to the different etched rates of polyimide and polyamide-imide on the substrate and the different undercut speeds, a staircase pattern is thus obtained as shown in FIG. 2(e).

Figure 3:
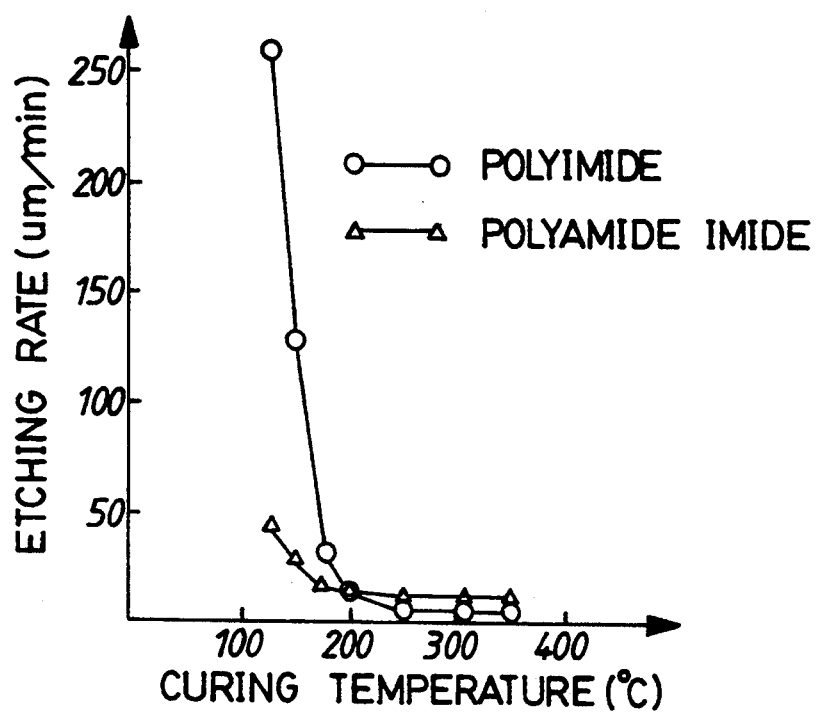
FIG. 3 is a schematic diagram showing the etching rate of polyimide and polyamide-imide (under an etchant at a temperature of 70° C.) with respect to curing temperature.
Figure 4:
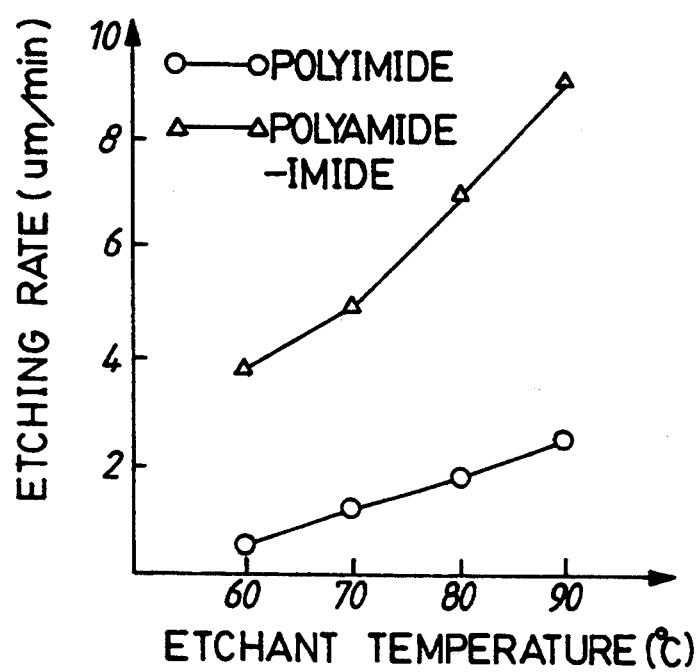
FIG. 4 is a schematic diagram showing the etching rate of polyimide and polyamide-imide (under a curing temperature of 300° C.) with respect to etchant temperature.
Figure 5:
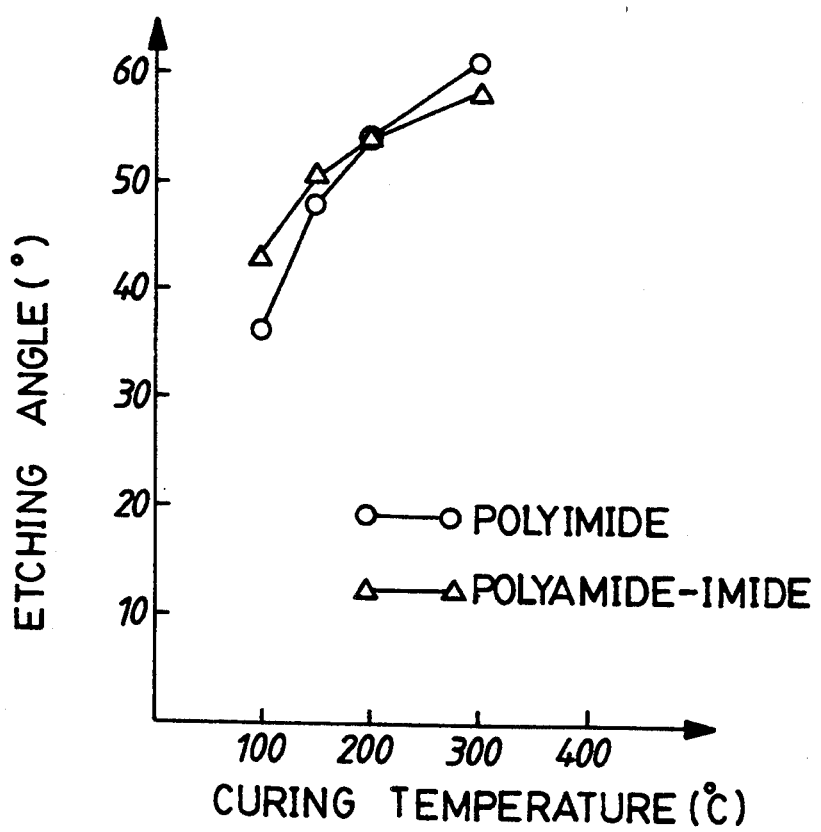
FIG. 5 is a schematic diagram showing the etching angle of polyimide and polyamide-imide (under an etchant at a temperature of 70° C.) with respect to curing temperature.

FIG. 3 is a schematic diagram showing the etched rate of polyimide and polyamide-imide under an etchant at a temperature of 70° C. with respect to curing temperature. FIG. 4 is a schematic diagram showing the etched rate of polyimide and polyamide-imide under a curing temperature of 300° C. with respect to etchant temperature. FIG. 5 is a schematic diagram showing the etched angle of polyimide and polyamide-imide under an etchant.

In accordance with the present invention, the formation of the viahole on the substrate is by employing polyamide-imide having the property of or similar to the property of polyimide as the pseudomask layer, and by employing the different etched rates of the etchant respectively on polyimide and polyamide-imide and the differences in undercutting to form staircase pattern. During the metallization, the contacting surface area between the metals is increased. Thus, it can be employed in flexible printed circuit (FPC) board, tape automatic bonding (TAB), and electronic packaging.

The above description is given on the preferred embodiments of the invention, but it will be apparent that many modifications and variations could be effected by one skilled in the art without departing from the spirit or scope of the novel concepts of the invention, so that the scope of the invention should be determined by the appended claims only.

We claim:

1. A method of wet etching a polyimide comprising the steps of:
    (a) cleaning a substrate for coating;
    (b) coating a polyamic acid varnish onto said cleaned substrate;
    (c) thermal curing the polyamic acid varnish to form a polyimide layer on the substrate;
    (d) coating a polyamide-imide varnish onto the polyimide layer formed in step (c);
    (e) curing the polyamide-imide varnish to form a polyamide-imide layer on the polyimide layer, said polyamide-imide and said polyimide having different etching rates under the action of a wet etchant;
    (f) coating a layer of photoresist onto the coated substrate;
    (g) masked exposing;
    (h) image developing the photoresist on said substrate to selectively remove the photoresist to produce at least one unprotected portion over the polyimide and polyamide-imide layers; and
    (i) wet etching the at least one unprotected portion of the polyimide and polyamide-imide layers using said wet etchant to form a staircase pattern on the substrate.

2. A method of wet etching of polyimide as claimed in claim 1, wherein the polyamic acid possesses the structure of (I)

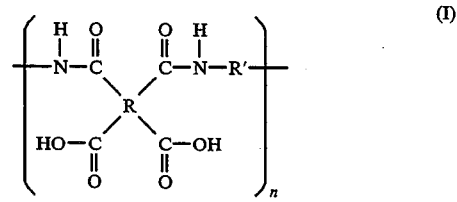

wherein R and R' are independently selected from the group consisting of aromatic group, aliphatic group, and group containing siloxane.

3. A method of wet etching of polyimide as claimed in claim 1, wherein the polyamide-imide varnish possesses the structure of (II)

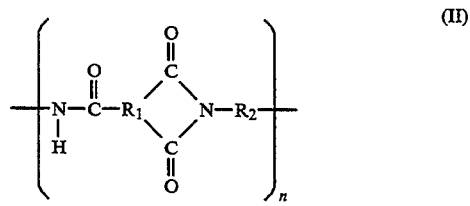

wherein R1 and R2 is selected from the group consisting of aromatic group, aliphatic group, and group containing siloxane.

4. A method of wet etching of polyimide as claimed in claim 1, wherein the temperature of curing of polyimide is ranging from 120° to 400° C.

5. A method of wet etching of polyimide as claimed in claim 1, wherein the temperature of curing of polyamide-imide is ranging from 120° to 350° C.

* * * * *